(12) United States Patent
Kim et al.

(10) Patent No.: US 7,842,961 B2
(45) Date of Patent: Nov. 30, 2010

(54) RED PHOSPHOR AND LUMINOUS ELEMENT USING THE SAME

(75) Inventors: Kyung Nam Kim, Seoul (KR); Sang Mi Park, Seoul (KR); Tomizo Matsuoka, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 11/913,538

(22) PCT Filed: Jun. 16, 2006

(86) PCT No.: PCT/KR2006/002330
§ 371 (c)(1),
(2), (4) Date: Nov. 2, 2007

(87) PCT Pub. No.: WO2006/135218
PCT Pub. Date: Dec. 21, 2006

(65) Prior Publication Data
US 2008/0191230 A1    Aug. 14, 2008

(30) Foreign Application Priority Data
Jun. 17, 2005    (KR) ............... 10-2005-0052524

(51) Int. Cl.
*H01L 33/00*    (2010.01)
(52) U.S. Cl. .................... 257/98; 257/E33.001
(58) Field of Classification Search .......... 257/98, 257/88, 233, 79, E25.032, E25.028, E33.001; 313/501, 503
See application file for complete search history.

(56) References Cited
U.S. PATENT DOCUMENTS
4,065,688 A    12/1977    Thornton
(Continued)

FOREIGN PATENT DOCUMENTS
JP    57-128772    8/1982
(Continued)

OTHER PUBLICATIONS
E. Philippot et al., "Relation between properties and structural evolution of some Si, Ge, Sn ternary chalogenides", (1997), React. Solids [Proc. Int. Symp.], 8th, Meeting date 1976, pp. 535-539.*
(Continued)

*Primary Examiner*—Thomas L Dickey
*Assistant Examiner*—Nikolay Yushin
(74) *Attorney, Agent, or Firm*—H.C. Park & Associates, PLC

(57) ABSTRACT

The present invention relates to a phosphor and a luminous element using the same. The present invention provides a phosphor for absorbing a portion of light emitted from a light source and emitting light with a wavelength different from that of the absorbed light. The phosphor comprises a fluorescent material having an alkaline earth metal-germanium metal-sulfur structure that contains Ge and at least one element selected from the group consisting of Sr and Ca and is activated by Eu. The phosphor of the present invention increases a color rendering index (CRI) of a white luminous element for a general lighting apparatus, and a luminous element using the phosphor has an advantage in that it is suitable for a white luminous element backlight which can substitute for a cold cathode fluorescent lamp (CCFL) in medium and large-sized TVs and has higher color reproducibility and higher white uniformity.

12 Claims, 3 Drawing Sheets

U.S. PATENT DOCUMENTS

| | | |
|---|---|---|
| 4,303,913 A | 12/1981 | Tohda et al. |
| 4,563,297 A | 1/1986 | Kukimoto et al. |
| 5,208,462 A | 5/1993 | O'Connor et al. |
| 5,598,059 A | 1/1997 | Sun et al. |
| 6,252,254 B1 | 6/2001 | Soules et al. |
| 6,501,102 B2 | 12/2002 | Mueller-Mach et al. |
| 6,521,915 B2 | 2/2003 | Odaki et al. |
| 6,680,569 B2 | 1/2004 | Mueller-Mach et al. |
| 6,686,691 B1 | 2/2004 | Mueller et al. |
| 6,783,700 B2 | 8/2004 | Tian et al. |
| 2003/0228412 A1 | 12/2003 | Chen |
| 2004/0104391 A1* | 6/2004 | Maeda et al. ............. 257/79 |
| 2005/0046334 A1* | 3/2005 | Fujiwara ............. 313/498 |
| 2005/0123243 A1* | 6/2005 | Steckl et al. ............. 385/40 |
| 2005/0236958 A1 | 10/2005 | Wang et al. |
| 2006/0082296 A1 | 4/2006 | Chua et al. |

FOREIGN PATENT DOCUMENTS

| | | |
|---|---|---|
| JP | 2004-161807 | 6/2004 |
| JP | 2004161807 | 6/2004 |
| JP | 2004-327492 | 11/2004 |
| JP | 2004327492 | 11/2004 |
| JP | 2005-019997 | 1/2005 |
| JP | 2005019997 | 1/2005 |
| JP | 2005-079500 | 3/2005 |
| KR | 10-2001-0101761 | 11/2001 |
| KR | 10-2005-0117165 | 12/2005 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| TW | 563261 | 11/2003 |
| WO | 0124229 | 4/2001 |
| WO | 03021691 | 3/2003 |
| WO | 03080763 | 10/2003 |
| WO | 2004-007636 | 1/2004 |
| WO | 2006-043200 | 4/2006 |
| WO | 2006-126817 | 11/2006 |

OTHER PUBLICATIONS

J. Baur, P. Schlotter, J. Schneider; "White Light Emitting Diodes", (1998), Adv. Solid State Phys., vol. 67, pp. 67-78.*

Baur et al. "White Light Emitting Diodes", (1998), Adv. Solid State Phys., vol. 67, pp. 67-78.*

* cited by examiner

[Fig. 1]
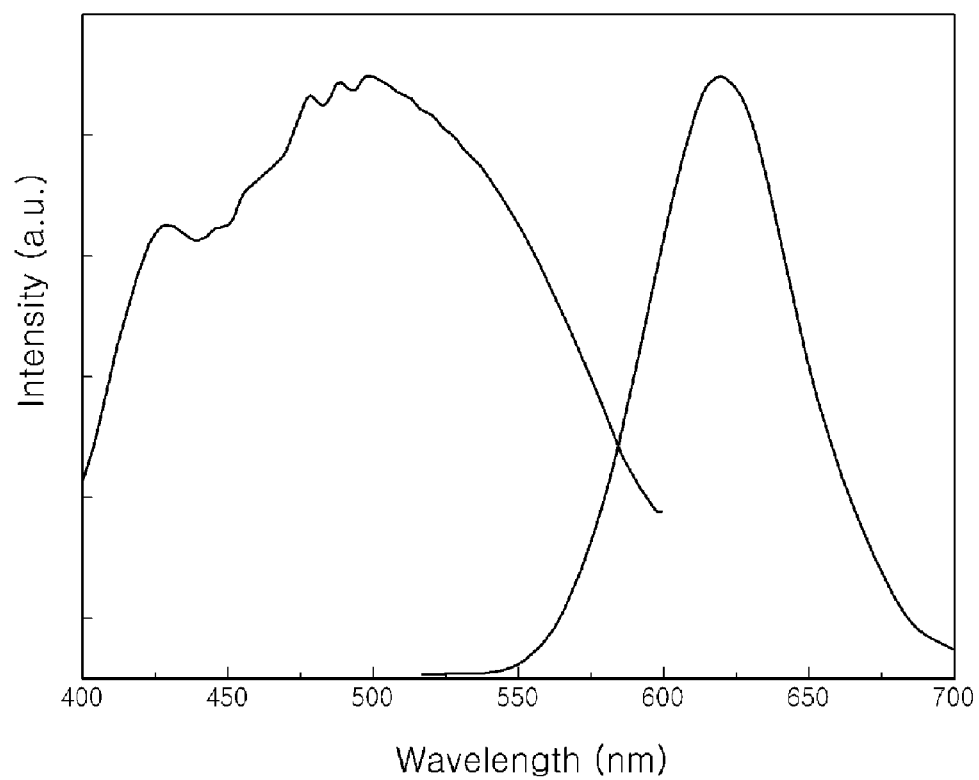
[Fig. 2]
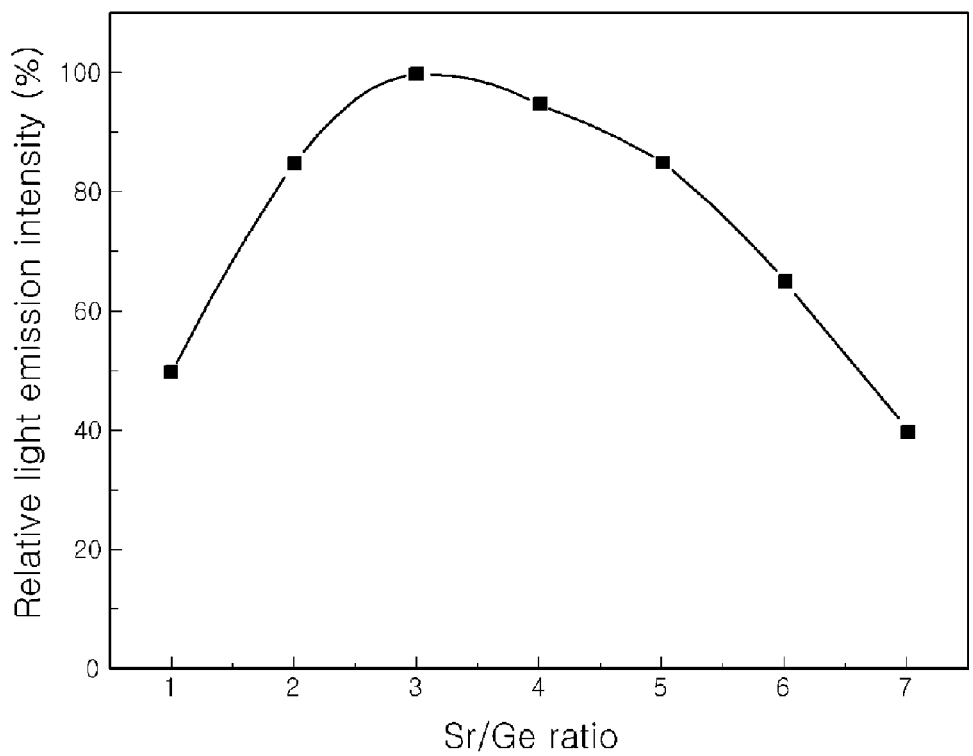

[Fig. 3]
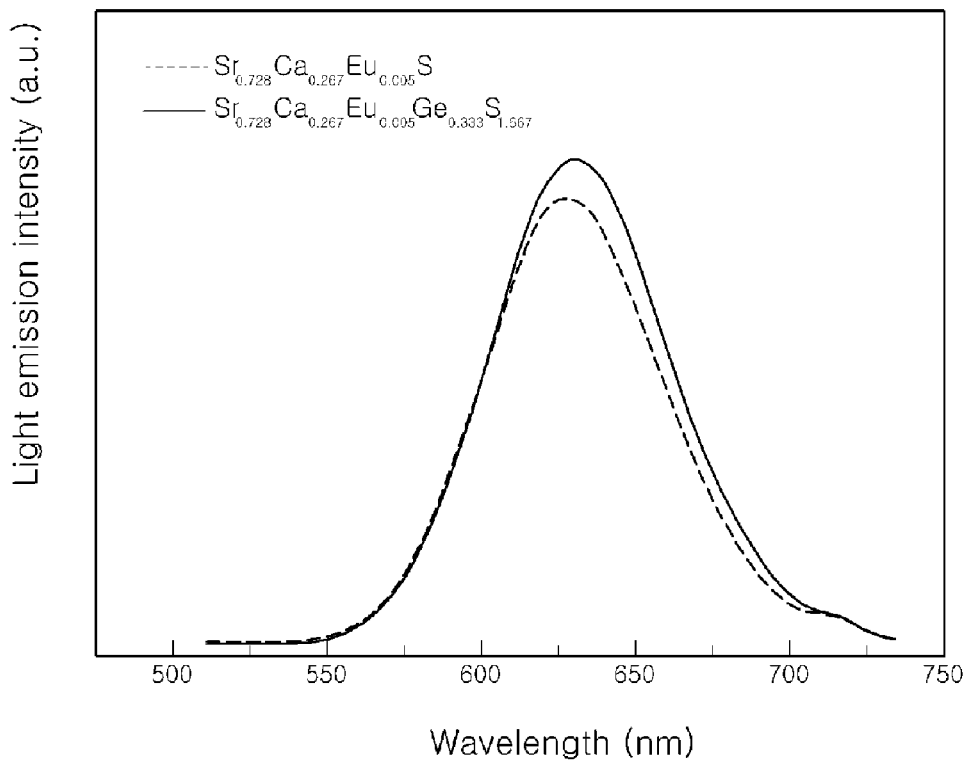
[Fig. 4]
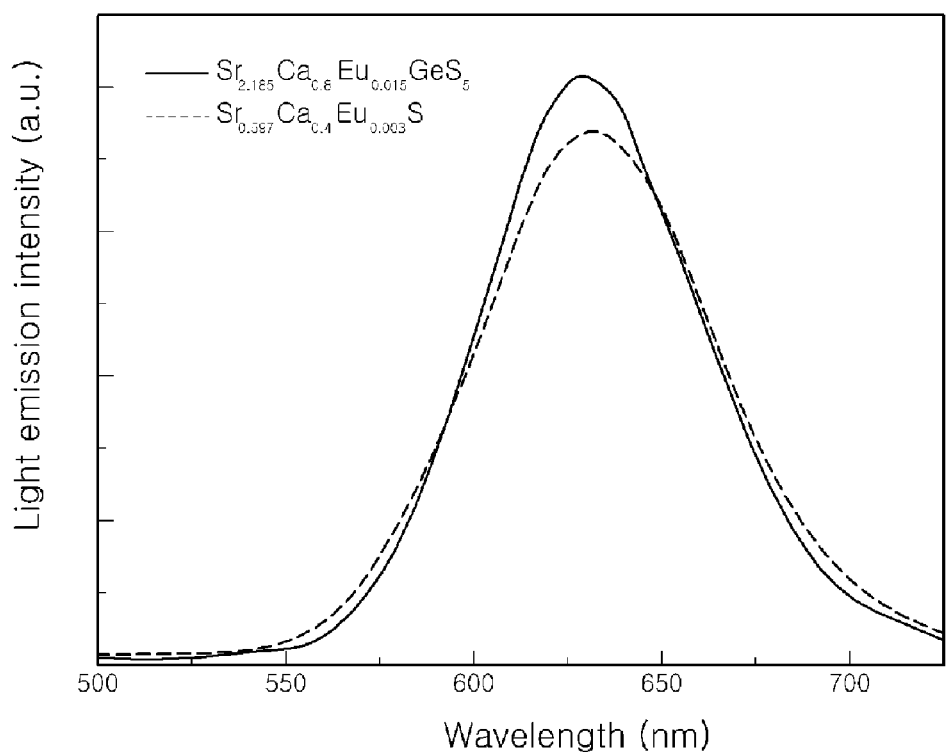

[Fig. 5]
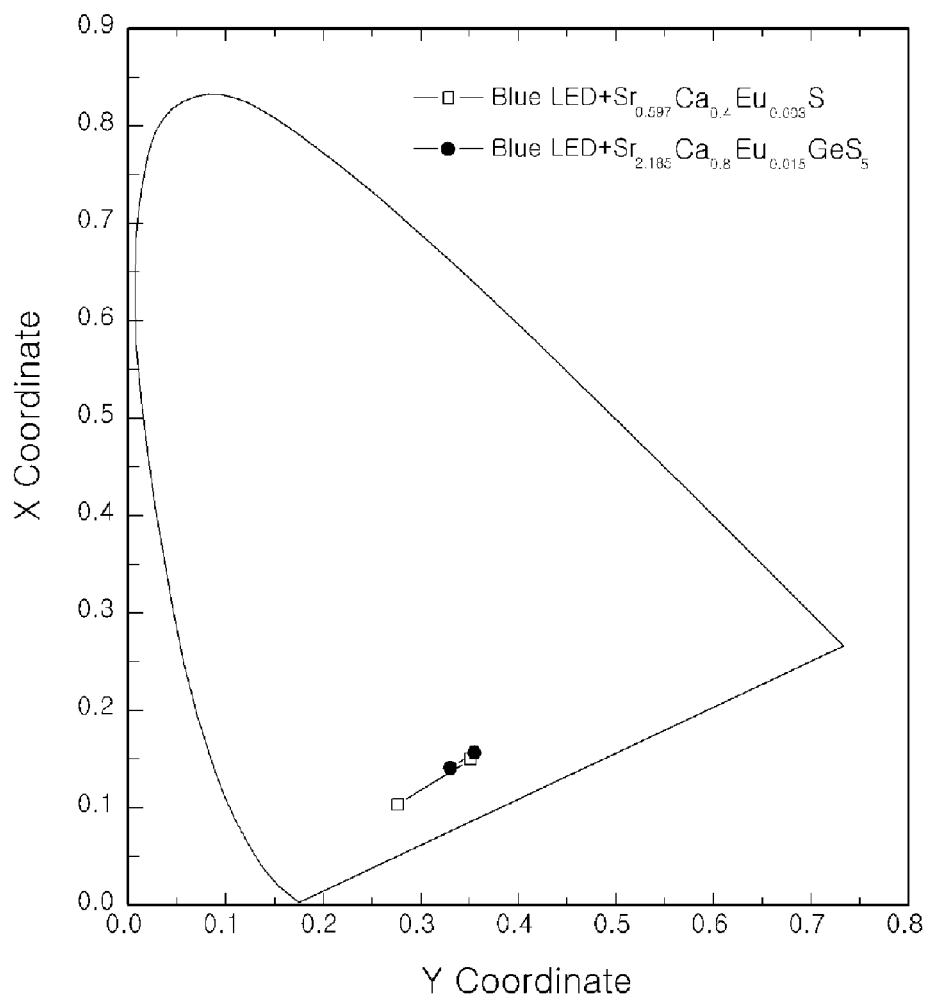
[Fig. 6]
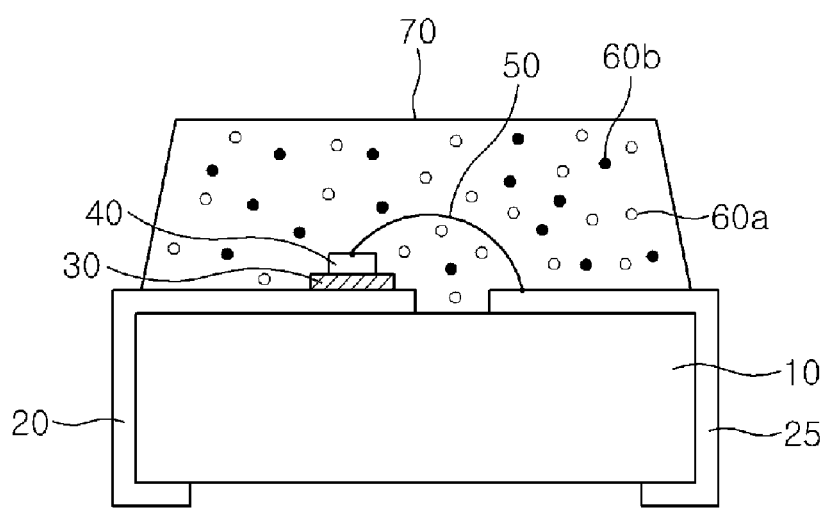

RED PHOSPHOR AND LUMINOUS ELEMENT USING THE SAME

CROSS-REFERENCE TO RELATED APPLICATION

This application is a U.S. national phase application of PCT International Application No. PCT/KR2006/002330, filed Jun. 16, 2006, which claims priority of Korean Patent Application No. 2005-052524, filed Jun. 17, 2005, the contents of which are incorporated herein by reference in their entirety.

TECHNICAL FIELD

The present invention relates to a phosphor and a luminous element using the same, and more particularly, a red light phosphor with a specific composition, which is suitable for implementing a white luminous element and has good efficiency, and a white luminous element using the same.

BACKGROUND ART

In general, a method of implementing a white luminous element is to combine a blue light emitting diode and a yellow light phosphor capable of being excited by blue light, or to combine green and red light phosphors capable of being excited by blue light. The former case has limitation on implementation of color rendering, whereas the latter case can implement a high color rendering index equal to or greater than 85.

As for the structure of a white luminous element, it has a GaInN semiconductor structure, and comprises a combination of a blue light emitting diode having a maximum light emission wavelength of 430 to 470 nm and a phosphor capable of being excited by a portion of blue light to perform conversion into yellow light, or a combination of phosphors capable of being excited by a portion of blue light to perform conversion into green and red light. As for the composition of a green light phosphor, a thiogallate group excited by blue light to emit green to yellow light can be used. The typical composition of the thiogallate group is represented by (Ca, Sr,Ba)(Al,Ga,In)$_2$S$_4$:Eu(or Ce). In this group, SrGa$_2$S$_4$:Eu phosphor is a green light phosphor with higher light emission intensity. On the other hand, a red light phosphor is used as a light emission source of red spectrum in which SrS:Eu, (Sr, Ca)S:Eu, CaS:Eu and the like utilize blue light as an excitation source.

However, the (Sr,Ca)S:Eu red light phosphor has serious drawbacks in that its light emission intensity is not sufficiently high and its chemical stability against moisture is lowered. Further, since the spectrum of the (Sr,Ca)S:Eu red light phosphor has a broader half-width, it overlaps with the spectrum of green light when the (Sr,Ca)S:Eu red light phosphor is applied to a white backlight for an LCD. Consequently, it is difficult to implement green and red color coordinates, which is regulated by the National Television Standard Committee (NTSC), after filtration through a color filter. Even in U.S. Pat. Nos. 6,252,254, 6,521,915, 6,501,102, 6,680,569, 6,686,691, 6,783,700 and the like, which disclose red light phosphors and luminous elements using the same, it cannot be significantly expected to obtain chemical stability and higher efficiency due to the above reasons. Therefore, there is a drawback in that they cannot be applied to a general lighting apparatus and a backlight for an LCD.

DISCLOSURE OF INVENTION

Technical Problem

Accordingly, the present invention is conceived to solve the aforementioned problems. An object of the present invention is to provide a phosphor and a luminous element using the same, wherein the color rendering of a white luminous element for a general lighting apparatus can be improved through development of a novel red light phosphor having an alkaline earth metal-germanium metal-sulfur structure.

Another object of the present invention is to provide a luminous element applicable to a white luminous element backlight that can substitute for a cold cathode fluorescent lamp (CCFL) in medium and large-sized TVs and has higher color reproducibility and higher white uniformity.

Technical Solution

To achieve these objects, the present invention provides a phosphor for absorbing a portion of light emitted from a light source and emitting light with a wavelength different from that of the absorbed light. The phosphor comprises a fluorescent material having an alkaline earth metal-germanium metal-sulfur structure that contains Ge and at least one element selected from the group consisting of Sr and Ca and is activated by Eu.

In addition, a phosphor of the present invention is represented by a general formula of $A_{(x-a)}Eu_{(a)}GeS_{(z)}$, wherein 'A' is at least one element selected from the group consisting of Sr and Ca, 'x' satisfies $2 \leq x \leq 5$, 'a' satisfies $0.0005 \leq a/x \leq 0.02$ and 'z' satisfies $z=x+2$.

In synthesizing the phosphor, it is preferred that 'x' satisfy $2.5 \leq x \leq 4$ and 'a' satisfy $0.001 \leq a/x \leq 0.01$. More preferably, 'x' satisfies $2.5 \leq x \leq 3.5$ and 'a' satisfies $0.003 \leq a/x \leq 0.007$.

A luminous element of the present invention comprises a light emitting diode, and the aforementioned phosphor.

The light emitting diode may emit ultraviolet rays or blue light. At this time, the phosphor of the luminous element may further comprises (Ba,Sr,Ca)$_2$SiO$_4$:Eu or SrGa$_2$S$_4$:Eu.

Advantageous Effects

According to the present invention described above, there is a significant advantage in that the color rendering of a white luminous element for a general lighting apparatus can be improved through development of a novel red light phosphor having an alkaline earth metal-germanium metal-sulfur structure. Further, the present invention is suitable for a white luminous element backlight and luminous elements with various colors, which can substitute for a cold cathode fluorescent lamp (CCFL) in medium and large-sized TVs and have higher color reproducibility and higher white uniformity.

The scope of the present invention is not limited to the embodiments described above but defined by the appended claims. It will be apparent that those skilled in the art can make various modifications and adaptations without departing from the scope and spirit of the present invention defined by the claims.

BRIEF DESCRIPTION OF THE DRAWINGS

The above and other objects, features and advantages of the present invention will become apparent from the following description of preferred embodiments given in conjunction with the accompanying drawings, in which:

FIG. 1 is a graph illustrating light emission and excitation spectra of a $Sr_3GeS_5$:Eu phosphor when a Sr/Ge ratio ranges from 2 to 5;

FIG. 2 is a graph illustrating light emission intensity depending on the Sr/Ge ratio;

FIG. 3 is a graph showing spectra for comparison of light emission between a (Sr,Ca)S:Eu phosphor and a phosphor with a desired amount of Ge introduced into the (Sr,Ca)S:Eu phosphor;

FIG. 4 is a graph showing light emission spectra of a conventional red phosphor and a red phosphor of the present invention, which have an identical light emission peak;

FIG. 5 is a graph illustrating color coordinates for result values of reliability of color changes in luminous element packages obtained by applying epoxy to the conventional red phosphor and the red phosphor of the present invention, which have an identical emission peaks; and FIG. 6 is a sectional view of a white luminous element according to an embodiment of the present invention.

BEST MODE FOR CARRYING OUT THE INVENTION

As described above, a (Sr,Ca)S:Eu red light emitting phosphor has been widely Used as a red emission component that can emit white light by means of excitation of a blue luminous element. However, such a phosphor may easily react with moisture and thus its chemical structure may be changed to hydrogen disulfide and a sulfur oxide of alkaline earth metal. Consequently, the (Sr,Ca)S:Eu red light phosphor used together with a molding compound in a luminous element causes a chemical reaction that leads to gradual disappearance of a red light spectrum. Therefore, there is a phenomenon in which hydrogen disulfide produced as a by-product of the reaction corrodes a metallic component in the luminous element device, resulting in rapid deterioration of optical properties.

The reactivity of a compound can be explained on the basis of a theory for ionic field strength. The ionic field strength is expressed as follows:

Ionic Field Strength=$m/b^2$ wherein 'm' is electrovalence, and 'b' is the distance between a metal and a negative ion.

Generally, an element with higher electrovalence in the Periodic Table has larger ionic field strength. A solid solution is formed between substances with similar ionic field strength, whereas a compound is formed in a combination of substances with a large difference in their ionic field strength. In a (Sr,Ca)S:Eu phosphor in which Sr of a SrS:Eu phosphor is partially substituted with Ca, the color of emitted light is shifted toward a longer wavelength due to changes in crystal field strength resulting from an ion size difference, whereas there is no difference in chemical properties of the materials since their crystalline structures are identical to each other.

In the present invention, based on the ion field strength theory, Ge that has a larger difference in ion field strength than Sr is introduced into SrS:Eu to synthesize a (Sr,Ca)—Ge—S:Eu based phosphor with a modified crystalline structure. That is, a phosphor with a novel composition, which has superior light emission efficiency and superior chemical stability against moisture to the conventional (Sr,Ca)S:Eu phosphor, is synthesized through introduction of Ge into (Sr,Ca).

The newly synthesized phosphor according to the present invention is represented by $A_{(x-a)}Eu_{(a)}GeS_{(z)}$, wherein 'A' is Sr, Ca or a combination thereof, 'x' satisfies $2 \leq x \leq 5$, 'a' satisfies $0.0005 \leq a/x \leq 0.02$, and 'z' satisfies $z=x+2$. A small amount of Eu is an element mainly responsible for light emission through electron energy transition from f-d excitation level to f ground state. A Sr/Ca ratio, a (Sr or Ca)/Ge ratio, and the like in the composition of this phosphor enable changes in an emission peak, and typical phosphors with varying wavelengths of 600 nm to 660 nm include $Sr_{2.985}Eu_{0.015}GeS_5$, $Sr_{2.185}Ca_{0.8}Eu_{0.015}GeS_5$, $Ca_{2.98}Eu_{0.02}GeS_5$, and the like.

A method of synthesizing a phosphor with superior properties according to the present invention employs $SrCO_3$, $CaCO_3$, $Eu_2O_3$, $GeO_2$ or the like as a starting material. First of all, based on a desired molar composition, $SrCO_3$ as an alkaline earth metal source, $CaCO_3$, and $Eu_2O_3$ as an activator are completely melted in nitric acid or hydrochloric acid, and then an excess amount of $(NH_4)_2CO_3$, $(NH_4)_2C_2O_4$ or the like is added to obtain a precipitate under a condition where the starting material is ideally dispersed. After the precipitate is completely dried, an amount of $GeO_2$ corresponding to a desired composition is mixed therewith. The mixture is heat-treated under a general oxygen atmosphere at a temperature of 1,000 to 1,200° C. for about 2 to 5 hours to remove carbon and to simultaneously prepare a compound in the form of an oxide. The oxide is repeatedly heat-treated under a sulfur dioxide atmosphere at a temperature of 900 to 1,250° C. for about 1 to 5 hours to completely convert the oxide into a sulfide. In most cases, a phosphor which has been heat-treated under a sulfur dioxide at a temperature of 900 to 1,250° C. has a particle distribution of 2 to 10 μm and exhibits high intensity of red light emission.

In order to obtain a composition of the phosphor exhibiting the best properties according to the present invention, the Sr/Ge ratio is optimized and the most suitable concentration of Eu is selected. Finally, Sr is partially substituted with Ca to synthesize a red light phosphor having a desired light emission peak. The optical properties thereof are evaluated in view of light emission intensity and an emission peak as compared with the (Sr,Ca)S:Eu phosphor.

In a phosphor-synthesizing experiment in which the concentration of Eu is fixed as 1 atomic % with respect to Sr while the Sr/Ge ratio is changed, a phosphor having excellent light emission intensity is synthesized when the Sr/Ge ratio is 2 to 5. FIG. 1 shows light emission and excitation spectra of a $Sr_3GeS_5$:Eu phosphor that exhibits the best excitation function for blue light in the aforementioned range.

FIG. 2 illustrates changes in light emission intensity depending on the Sr/Ge ratio.

In a range in which the Sr/Ge ratio is not greater than 1, the light emission property rapidly disappears. In a range in which the Sr/Ge ratio is not less than 5, the color of emitted light is not uniform and the light emission property is rapidly deteriorated.

FIG. 3 shows spectra for comparison of light emission between a (Sr,Ca)S:Eu phosphor and a phosphor with a desired amount of Ge introduced into the (Sr,Ca)S:Eu phosphor. When their light emission peaks are compared with each other, the introduction of Ge in the latter phosphor causes a change in its crystalline structure and such a change in the crystalline structure affects Eu, which is an element mainly responsible for light emission, thereby causing a phenomenon in which the emission peak is shifted toward a longer wavelength.

Considering the concentration of Eu, phosphors having different concentrations of Eu are synthesized based on the composition of $Sr_3GeS_5$. Eu is added to partially substitute for Sr. When the concentration of Eu is 0.05% with respect to Sr, Eu ions are not enough, resulting in insufficient light emission. On the contrary, even when the concentration of Eu is 2% or more, light emission intensity is lowered. A preferable range of the composition of Eu is 0.1% to 1.0%, and a more preferable range of the composition of Eu is 0.3% to 0.7%.

Such an optimum range of Eu is shown as consistent results in various phosphors having different Sr/Ge ratios or Sr/Ca ratios. An optimum value of the concentration of Eu exhibiting light emission intensity is 0.5 atomic % with respect to Sr.

Considering partial substitution of Sr by Mg, Ba or Ca, which is in the same group and has a high possibility of substituting for a Sr ion, the substitution of Sr by Mg or Ba causes remarkable deterioration of light emission intensity. Only the substitution of Sr by Ca successfully achieves a shift of the light emission peak toward a longer wavelength without a significant change in the light emission intensity.

FIG. 4 shows light emission spectra of a commercial $Sr_{0.597}Ca_{0.4}Eu_{0.003}S$ phosphor and a $Sr_{2.185}Ca_{0.8}Eu_{0.015}GeS_5$ phosphor of the present invention, which have the same light emission peak.

In spite of a relatively small amount of Ca, the introduction of Ge ensures the same light emission peak and exhibits light emission intensity increased by about 10%.

Further, it can be seen from the figure that the half-width of the phosphor of the present invention is narrower than that of the (Sr,Ca)S:Eu phosphor. This is considerably advantageous to a white backlight for an LCD, which can improve color reproducibility after filtering, since the narrower half-width reduces a difference between the color of emitted light and a human color sense.

FIG. 5 illustrates changes in x-values of color coordinates with respect to an initial value, which are results of reliability tests for color changes in luminous element packages obtained by applying epoxy to both the conventional (Sr,Ca)S:Eu phosphor and a phosphor obtained by introducing Ge into the (Sr,Ca)S:Eu phosphor. The changes in the x-values of the color coordinates represents a phenomenon in which the coordinates are shifted toward blue light as the composition of the phosphor is decomposed due to its reaction with moisture and its optical properties are lost. It can be seen from the reliability test results under an external atmosphere having moisture of 90% at a temperature of 60° C. that the changes in the x-values of the color coordinates of the phosphor according to the present invention into which Ge is introduced are relatively smaller than that of the conventional (Sr,Ca)S:Eu phosphor.

FIG. 6 is a longitudinal sectional view of a white luminous element according to an embodiment of the present invention.

The white luminous element of the present invention comprises a substrate 10, a pair of electrodes 20 and 25 formed on the substrate 10, a blue light emitting diode 40 mounted on one electrode 20 by means of a conductive adhesive 30, a wire 50 for connecting the blue light emitting diode 40 with the electrode 20, and an epoxy resin 70 molded together with both (Sr,Ca)—Ge—S:Eu based red phosphors 60a and (Ba,Sr,Ca)$_2$SiO$_4$:Eu or SrGa$_2$S$_4$:Eu green phosphors 60b. The (Sr,Ca)—Ge—S:Eu based red phosphors 60a and the (Ba,Sr,Ca)$_2$SiO$_4$:Eu or SrGa$_2$S$_4$:Eu green phosphors 60b receive blue light emitted from the blue light emitting diode 40 and then emit white light. An InGaN based light emitting device may be used as the blue light emitting diode 40. Although the luminous element has been described as a chip-on-board (COB) type in this embodiment, the luminous element of the present invention is not limited thereto but may be a lamp type or the like. In this embodiment, the red phosphor of the present invention is applied, in combination of the green phosphor, to the blue luminous element in order to obtain white light. However, it will be apparent that combinations of other phosphors and other color luminous elements may be used to obtain different color light except white light. For example, the phosphor of the present invention can convert a portion of blue light emitted from the blue luminous element into red light, so that purple or pink light can be emitted.

For a white luminous element for a general lighting apparatus, it is required to improve color rendering that is a measure indicating how similar white light is to natural light. To this end, the blue light emitting diode 40 is used as a base, and the (Sr,Ca)—Ge—S:Eu based red phosphors 60a of the present invention and the SrGa$_2$S$_4$:Eu or (Ba,Sr,Ca)$_2$SiO$_4$:Eu green phosphors 60b are mixed with epoxy resin. Then, the mixture is molded on the light emitting diode. In this case, it is possible to obtain a color rendering index of about 90 increased by up to 10% over a general white luminous element that comprises a combination of a blue light emitting diode and an YAG:Ce yellow light phosphor and has a color rendering index of 85 or less. Accordingly, it is determined that the red phosphor of the present invention is suitable for a light emitting source of a red spectrum for a general lighting apparatus.

What is claimed is:

1. A phosphor for absorbing a portion of light emitted from a light source and emitting light with a wavelength different from that of the absorbed light, the phosphor comprising:
   a fluorescent material having an alkaline earth metal-germanium metal-sulfur structure that contains Ge and Ca and is activated by Eu,
   wherein the phosphor is represented by a general formula of $A_{(x-a)}Eu_{(a)}GeS_{(z)}$, and
   wherein 'A' is at least one element selected from the group consisting of Sr and Ca, 'x' satisfies $2.5 \leq x \leq 4$, 'a' satisfies $0.001 \leq a/x \leq 0.01$ and 'z' satisfies $z=x+2$.

2. A luminous element, comprising:
   a light emitting diode; and
   a phosphor according to claim 1.

3. The luminous element as claimed in claim 2, wherein the light emitting diode emits ultraviolet rays or blue light.

4. The luminous element as claimed in claim 2, wherein the luminous element is a white luminous element that has the light emitting diode capable of emitting blue light and further comprises a green light phosphor.

5. The luminous element as claimed in claim 4, wherein the green light phosphor includes (Ba,Sr,Ca)$_2$SiO$_4$:Eu.

6. The luminous element as claimed in claim 4, wherein the green light phosphor includes SrGa$_2$S$_4$:Eu.

7. The phosphor as claimed in claim 1, wherein the fluorescent material further contains Sr, wherein the Sr is partially substituted by Ca and partially substituted by Eu.

8. A phosphor represented by a general formula of $A_{(x-a)}Eu_{(a)}GeS_{(z)}$, wherein 'A' is at least one element selected from the group consisting of Sr and Ca, 'x' satisfies $2.5 \leq x \leq 4$, 'a' satisfies $0.001 \leq a/x \leq 0.01$ and 'z' satisfies $z=x+2$.

9. The phosphor as claimed in claim 8, wherein 'x' satisfies $2.5 \leq x \leq 3.5$ and 'a' satisfies $0.003 \leq a/x \leq 0.007$.

10. A luminous element, comprising:
    a light emitting diode; and
    a phosphor according to claim 9.

11. A luminous element, comprising:
    a light emitting diode; and
    a phosphor according to claim 8.

12. The phosphor as claimed in claim 8, wherein 'A' consists of Sr and Ca, the Sr partially substituted by Ca and partially substituted by Eu.

* * * * *